United States Patent [19]

Freyman et al.

[11] Patent Number: 5,640,407

[45] Date of Patent: Jun. 17, 1997

[54] TEMPERATURE REGULATING LASER DIODE ASSEMBLY

[75] Inventors: Christopher A. Freyman, Allentown; Richard A. Di Domizio, Hatfield; James S. Robb, Quakertown, all of Pa.

[73] Assignee: Accu-Sort Systems, Inc., Telford, Pa.

[21] Appl. No.: 431,290

[22] Filed: Apr. 28, 1995

[51] Int. Cl.$^6$ ........................................ H01S 3/04
[52] U.S. Cl. .................. 372/36; 372/33; 372/34; 372/109
[58] Field of Search .......................... 372/36, 43–46, 372/34, 109, 33

[56] References Cited

U.S. PATENT DOCUMENTS

| | | | |
|---|---|---|---|
| 4,661,959 | 4/1987 | Kaneko | 372/34 |
| 4,803,689 | 2/1989 | Shibanuma | 372/36 |
| 4,993,801 | 2/1991 | Sarraf | 372/36 |
| 5,008,895 | 4/1991 | Martin | 372/69 |
| 5,099,487 | 3/1992 | Rickey et al. | 372/35 |
| 5,101,412 | 3/1992 | Pillsbury et al. | 372/34 |
| 5,291,504 | 3/1994 | Bournes | 372/34 |
| 5,363,391 | 11/1994 | Matthews et al. | 372/36 |
| 5,371,753 | 12/1994 | Adsett | 372/36 |
| 5,386,427 | 1/1995 | Zayhowski | 372/34 |

FOREIGN PATENT DOCUMENTS

| | | | |
|---|---|---|---|
| 0542379A1 | 11/1992 | European Pat. Off. | |
| 1119 | 1/1980 | Japan | 372/34 |
| 57-70726 | 4/1982 | Japan | |
| 168024 | 10/1983 | Japan | 372/36 |
| 197186 | 11/1984 | Japan | 372/36 |
| 850056943 | 3/1985 | Japan | |

OTHER PUBLICATIONS

Applied Optics article, Jul. 1, 1990, vol. 29, No. 19 p. 2827.

*Primary Examiner*—James W. Davie
*Attorney, Agent, or Firm*—Volpe and Koenig, P.C.

[57] ABSTRACT

An improved laser diode assembly includes a laser diode unit which is mounted directly on a compact thermoelectric cooler, which is mounted on a heat sink. A thermally insulating gasket, mounted around the thermoelectric cooler, seals the thermoelectric cooler from the ambient environment, thereby preventing condensation from forming on the cold face of the thermoelectric cooler. A bushing concentrically positions the laser diode unit in the proper optical alignment with respect to the optical assembly, while thermally and electrically insulating the laser diode. A thermally conductive gasket, mounted around the circumference of the laser diode window, returns heat from the heat sink to the window to prevent condensation from forming on the window. The laser diode is the only component cooled by the thermoelectric cooler. Since a portion of the heat transferred by the thermoelectric cooler is utilized to warm the laser diode window, a separate heating element is not required. This increases the overall efficiency of the laser diode assembly.

22 Claims, 4 Drawing Sheets

TEMPERATURE REGULATING LASER DIODE ASSEMBLY

BACKGROUND OF THE INVENTION

1. Field Of The Invention

This invention relates generally to laser diode assemblies. More specifically, it pertains to a temperature regulating laser diode assembly having a thermoelectric cooling unit for permitting operation of the laser diode in harsh environmental conditions.

2. Description Of Related Art

Laser diodes have become preferred electronic components for applications requiring an inexpensive source of coherent light. Laser diodes, otherwise known as semiconductor lasers, are ideal for highly accurate optical information collection, transmission and processing. As the power and efficiency of laser diodes have increased, the variety of uses for laser diodes has greatly expanded. Once used solely for scientific and research applications, laser diodes are now employed in many commercial and consumer products.

The bar code scanner identification industry, in particular, uses laser diodes in many applications that require small, low-power laser scanners. Scanners using laser diodes are smaller, lighter and draw less power than helium-neon based laser scanners, which were previously the most commonly used type of laser scanner. As laser diode scanners have become more popular, they have been used in a variety of wide-ranging scanning applications including point-of-sale checkout terminals, assembly and production line tracking systems, and warehouse storage systems.

Depending upon the particular application, laser diode scanners may be subject to harsh environmental conditions that are less than ideal for electronic components, including high temperature and high humidity environments. Operating a laser diode at elevated temperatures for extended periods of time decreases the expected operating life of the component, thereby increasing maintenance costs and associated down-time of the scanning system.

Present scanning systems utilize thermoelectric coolers to remove heat from a laser diode, thereby reducing the temperature and preventing thermal degradation of the diode. A typical scanning device which employs a laser diode and a thermoelectric cooler is shown in FIG. 1. This system includes a laser diode 10 which is mounted on a retainer plate 12. The plate 12 is supported by a thermally conductive spacer 14 which is coupled to a thermoelectric cooler 16. A thermally conductive flange 18 holds an optical assembly 20 in a supported relationship with the diode 10 via two screws 19. Since the optical assembly 20 and the laser diode 10 are coupled by thermally conductive materials, they are maintained at the same temperature. A thermistor 24 detects the temperature of the spacer 14 and regulates the thermoelectric cooler 16 to keep the optical assembly 20 and laser diode 10 at a desired operating temperature. The laser diode 10 and the optical assembly 20 are hermetically sealed in a thermally insulated housing 22, which has an optically transparent window 26 for permitting the laser beam to exit.

Although present assemblies compensate for high ambient temperatures, they require coolers with sufficient capacity to cool the entire assembly. Additionally, these systems require complete thermal isolation of internal electronic components from the ambient environment, resulting in scanning systems that are bulky and inefficient.

When a laser diode is cooled below the temperature of the ambient environment, condensation may form on the laser diode window. Although a small heating element may be used to heat the window and prevent the formation of condensation, this further reduces the efficiency and increases the size of the scanning system.

Accordingly, there exists a need for a laser diode assembly that efficiently maintains the laser diode at the recommended operating temperature while preventing condensation from forming on the laser diode window.

SUMMARY OF THE INVENTION

The present invention comprises an improved laser diode assembly including a laser diode unit which is mounted directly on a compact thermoelectric cooler. The thermoelectric cooler is mounted on a male heat sink, which is coupled to a female heat sink. A thermally insulating gasket, mounted around the thermoelectric cooler and between the male and female heat sinks, seals the thermoelectric cooler from the ambient environment, thereby preventing condensation from forming on the cold face of the thermoelectric cooler. A Delrin® bushing concentrically positions the laser diode unit in the proper optical path with respect to the optical assembly, while thermally and electrically insulating the laser diode from the heat sinks and all other external metallic components. Thus, the laser diode is less susceptible to electrostatic discharge, which may cause damage to the diode. A thermally conductive gasket, mounted around the circumference of the laser diode window, returns a portion of the heat from the heat sinks to the window to prevent condensation from forming on the window.

The laser diode is the only component cooled by the thermoelectric cooler. Accordingly, reduced thermoelectric cooler size and more efficient operation of the laser diode assembly is achieved. Since a portion of the heat transferred by the thermoelectric cooler is utilized to warm the laser diode window, a separate heating element is not required. This increases the overall efficiency of the laser diode assembly.

Accordingly, it is an object of the present invention to provide an efficient laser diode assembly which can operate in adverse temperature and humidity environments without decreasing the operating life of the laser diode.

It is a further object of the invention to provide a laser diode assembly which maintains each part of the laser diode at the desired operating temperature.

It is a further object of the invention to provide a method for cooling the flange of a laser diode unit while simultaneously heating the can of a laser diode unit directly around the window.

Other objects and advantages of the system will become apparent to those skilled in the art after reading the detailed description of a presently preferred embodiment.

DETAILED DESCRIPTION OF THE PREFERRED EMBODIMENT

Figure 1:
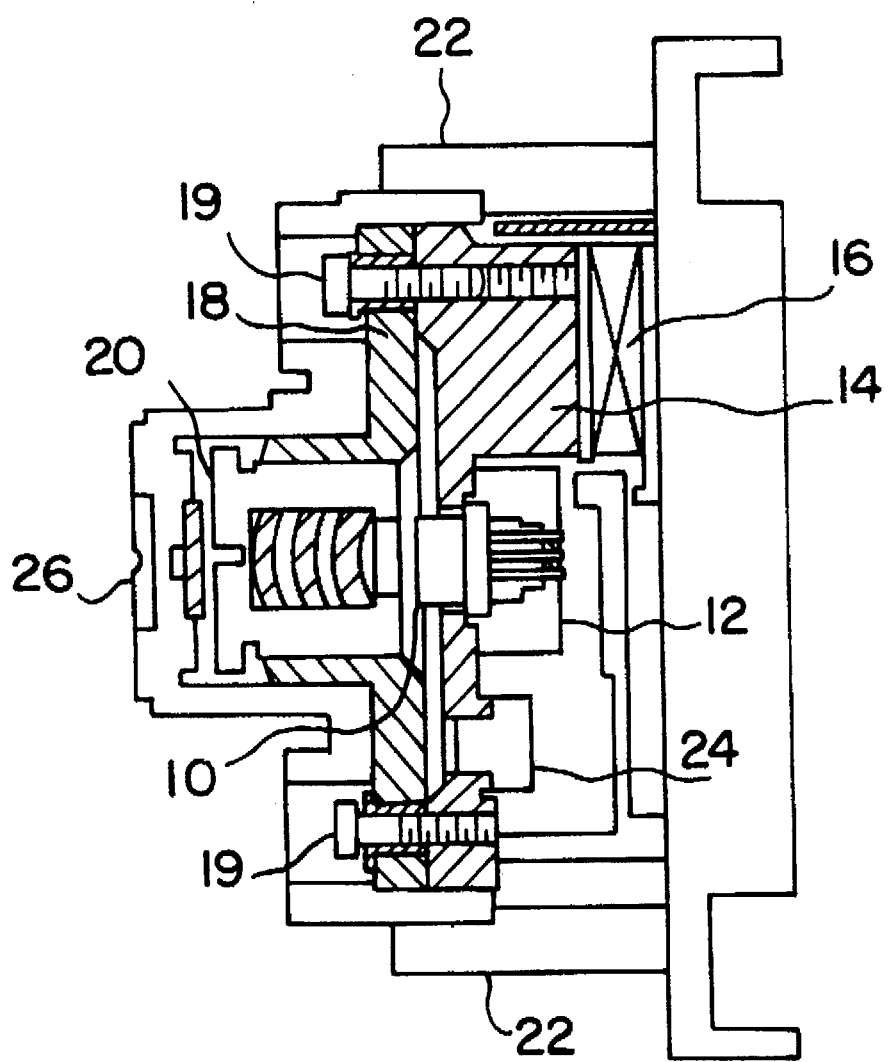
FIG. 1 is a diagram of a prior art laser diode assembly.
Figure 2:
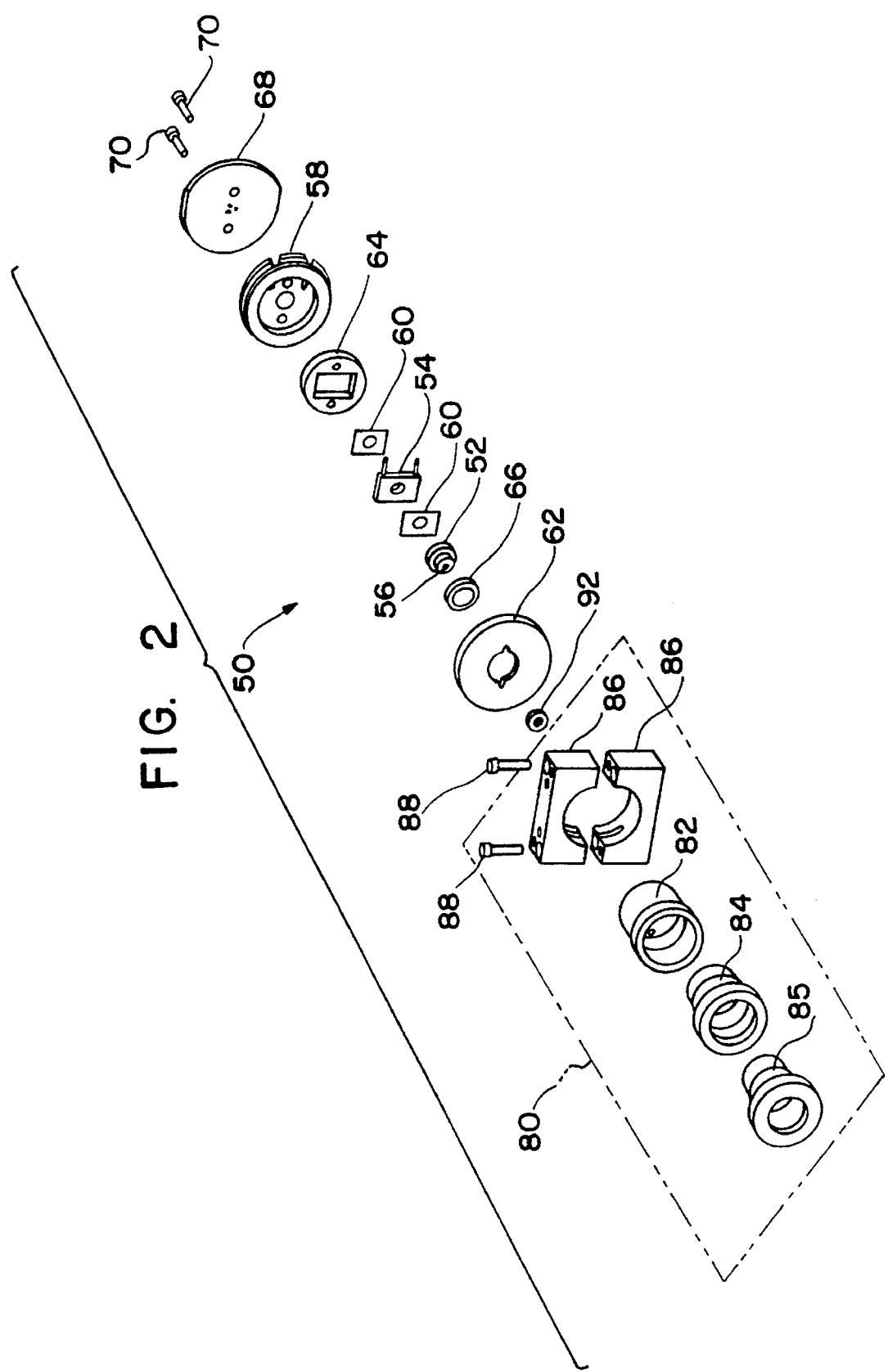
FIG. 2 is an exploded view of the laser diode assembly of the present invention.

Referring to FIG. 2, the preferred embodiment of the laser diode assembly 50 of the present invention is shown. The laser diode assembly 50 comprises a laser diode unit 52 mounted on a thermoelectric cooler semiconductor chip (TE cooler) 54. The laser diode unit 52 comprises two sections; a cylindrically-shaped housing or "can" portion and a substantially flat base or "flange" portion. The laser diode semiconductor substrate, which generates the laser beam, is thermally coupled to the flange. The substrate may be mounted directly on the flange, which provides heatsinking for the substrate. This provides a highly conductive thermal path for removing heat from the substrate. The can portion includes an aperture which typically has an optically transparent window 56 through which the laser beam emanates. The can is welded to the flange to hermetically seal the laser diode unit 52. Since the laser diode substrate is thermally coupled to the flange, most of the heat generated by the substrate is removed from the flange rather than the can.

The size and power of the laser diode unit 52 depends upon the particular application for which the laser diode assembly 50 will be used. In the preferred embodiment, the laser diode unit 52 is a Toshiba Model No. TOLD9215(S). The technical specifications of the laser diode unit 52 are shown in Table 1.

TABLE 1

| LASER DIODE CHARACTERISTIC | TYPICAL RATING |
| --- | --- |
| Optical Output Power | 10 mW |
| LD Reverse Voltage | 2 V |
| PD Reverse Voltage | 30 V |
| Operation Case Temperature | −10–50° C. |
| Threshold Current | 35 mA |
| Operation Current | 45 mA |
| Operation Voltage | 2.4 V |
| Lasing Wavelength | 670 nm |
| Beam Divergence | 8 ∥ 28 ⊥ |
| Monitor Current | 0.04 mA |
| PD Dark Current | 100 nA (max) |
| PD Total Capacitance | 20 pF (max) |

The heat transferring capacity of the TE cooler 54 depends upon the power of the laser diode unit 52 selected. In the preferred embodiment, the TE cooler 54 is a Melcor, Corporation Model No. SHO.8-28-05L. The technical specifications of the TE cooler 54 are shown in Table 2.

TABLE 2

| THERMOELECTRIC COOLER CHARACTERISTIC | MAXIMUM RATINGS |
| --- | --- |
| Current | 2.6 A |
| Power | 4.9 W |
| Voltage | 3.4 V |
| Temperature Difference (ΔTmax) | 67° C. |

Referring again to FIG. 2, the TE cooler 54 is mounted upon a male heat sink 58. In the preferred embodiment, thermally conductive tape 60 is used to couple the laser diode unit 52 to the TE cooler 54, and the TE cooler 54 to the male heat sink 58. The thermally conductive tape 60 adhesively bonds the three components 52, 54, 58 together and provides thermal conductivity therebetween. A female heat sink 62 is frictionally coupled to the male heat sink 58. A thermal gasket 64 surrounds the interface between the cold and hot faces of the TE cooler 54, and fills the interior chamber created by the male heat sink 58 and the female heat sink 62. The gasket 64 seals the TE cooler 54 from the ambient environment. This prevents condensation from forming on the cold face of the TE cooler 54, which may corrode the TE cooler 54 and result in premature failure. The gasket 64 also stabilizes the temperature of the interior chamber. In the preferred embodiment, the gasket 64 is made of closed-cell foam, manufactured by Stockwell Rubber Co. A bushing 66, having an inner diameter (or pilot diameter) which is sized to fit around the laser diode unit 52 and an outer diameter (or boss diameter) sized to engage and concentrically position the laser diode unit 52 in the proper optical path with respect to a telescopic optical assembly 80. The bushing 66, made from a polymer, preferably Delrin®, also provides electrical and thermal isolation of the laser diode 52 from the male and female heat sinks 58, 62 and any other external metallic components. This makes the laser diode 52 less vulnerable to damage caused by electrostatic discharge.

A printed circuit (PC) board 68, mounted directly to the male heat sink 58 by two socket head cap screws 70 supports driver circuitry for the laser diode unit 52 and the TE cooler 54. The screws 70 extend through the driver board 68, the male heat sink 58, the thermal gasket 64, and the female heat sink 62 to a barrel 82 which is part of the telescopic optical assembly 80. Accordingly, the entire laser diode assembly 50 is securely fastened as a unitary structure by the two screws 70.

A thermistor 108 (shown in FIG. 3) is mounted on the side of the PC board 68 facing the laser diode unit 52. The thermistor 108 touches the center of the flange between the leads of the laser diode unit 52 to directly monitor the temperature of the flange. The PC board 68 also includes all of the electronic components for controlling the operation of the laser diode unit 52 and the TE cooler 54. External electrical connections to the PC board 68 are made via a multi-pin connector. As will be appreciated by those skilled in the art, a detailed description of each electronic component is outside the scope of this invention.

The telescopic optical assembly 80 comprises a barrel 82 which is threadably coupled to one or more lens assemblies 84, 85 and held by a clamp collar 86. The optical assembly collimates and focuses the laser beam 100. The clamp collar 86 comprises a split ring having two complimentary sections which are fastened together with socket head cap screws 88. The clamp collar 86 frictionally clamps the barrel 82 onto the bar code scanner. The collar 86, made of aluminum, is an extension of the male and female heat sinks 58, 62. The female heat sink 62 makes full contact with the face of both sections of the collar 86. In order to facilitate the most effective conduction of heat, thermally conductive grease is applied between the interfacing surfaces of the female heat sink 62 and the clamp collar 86.

A thermally conductive laser diode washer 92 is disposed between the barrel 82 and the laser diode unit 52. The washer 92 is configured in an "flat ring" shape with an inner diameter complimenting the circumference of the laser diode window 56 and an outer diameter sized to fit within the barrel 82. Accordingly, the washer 92 conducts heat from the barrel 82 to the top of the can directly around the laser diode window 56. The washer 92 is electrically non-conductive, thereby preventing an electrostatic discharge introduced to the laser diode assembly 50 from damaging the laser diode unit 52. Preferably, the washer is a thermally conductive silicone sponge, part # R10404, manufactured by Stockwell Rubber Co. The sponge material accommodates different laser diode can heights and assures positive conductive contact when assembling the laser diode assembly 50, without crushing the can or cracking the laser diode window 56.

Figure 3:
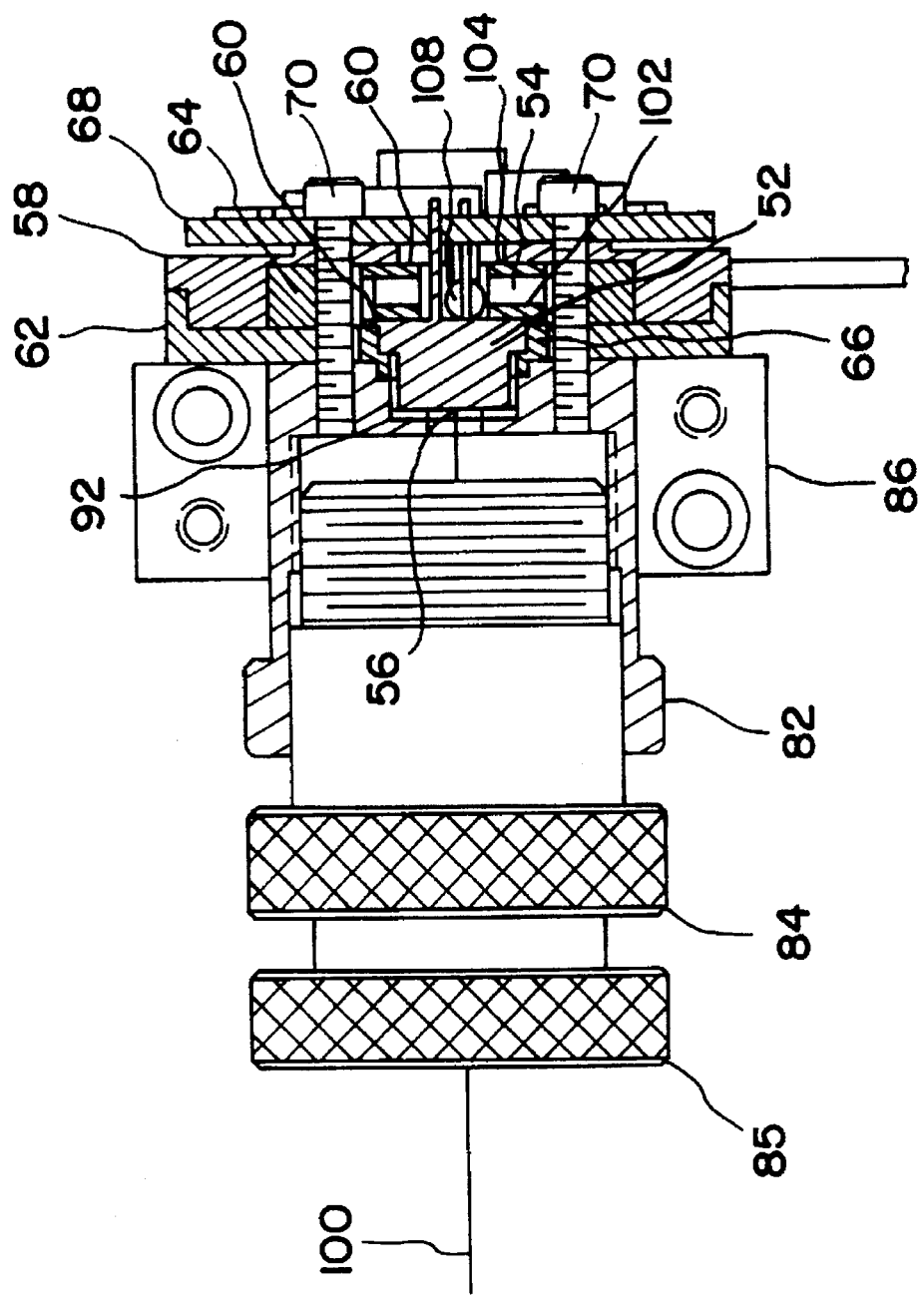
FIG. 3 is a cross-sectional view of the laser diode assembly of FIG. 2.

The operation of the preferred embodiment of the present invention will be explained with reference to FIG. 3. When the laser diode unit 52 is operating, a beam of light 100 is emitted. As previously described, a portion of the power applied to the laser diode unit 52 is converted to heat since the laser diode 52 is not 100% efficient. To prevent heat generated by the laser diode 52 from thermally degrading the laser diode unit 52, the TE cooler 54 is provided to transfer the heat away from the laser diode unit 52 and to keep the laser diode unit 52 at the desired operating temperature.

A thermoelectric cooler is essentially an electronic heat pump which uses the Peltier effect to transfer heat from one face of the cooler to the other. Referring again to FIG. 3, when current is applied to the TE cooler 54, heat is transferred from the cold face 102 to the hot face 104. Accordingly, one face of the TE cooler 54 is "cool" and the other side is "warm". Since the laser diode unit 52 is coupled to the cold face 102 of the TE cooler 54, the heat generated by the laser diode unit 52 is transferred by the TE cooler 54 to the hot face 104 and then to the male heat sink 58. The heat is further conducted by the male heat sink 58 to the female heat sink 62, the barrel 82 and the clamp collar 86. The lens assemblies 84, 85 are not significantly warmed since the interface between lens assembly 84 and the barrel 82 is a poor thermal conductor. This interface primarily comprises air gaps and a barrel thread lubricant.

The barrel 82 conducts a portion of the heat from the female heat sink 62 to the laser diode 52 via the thermally conductive laser diode washer 92. As shown in FIG. 3, the washer 92 is located about the periphery of the laser diode window 56 to conduct heat to the window 56 thereby preventing condensation from forming on the window 56.

Figure 4:
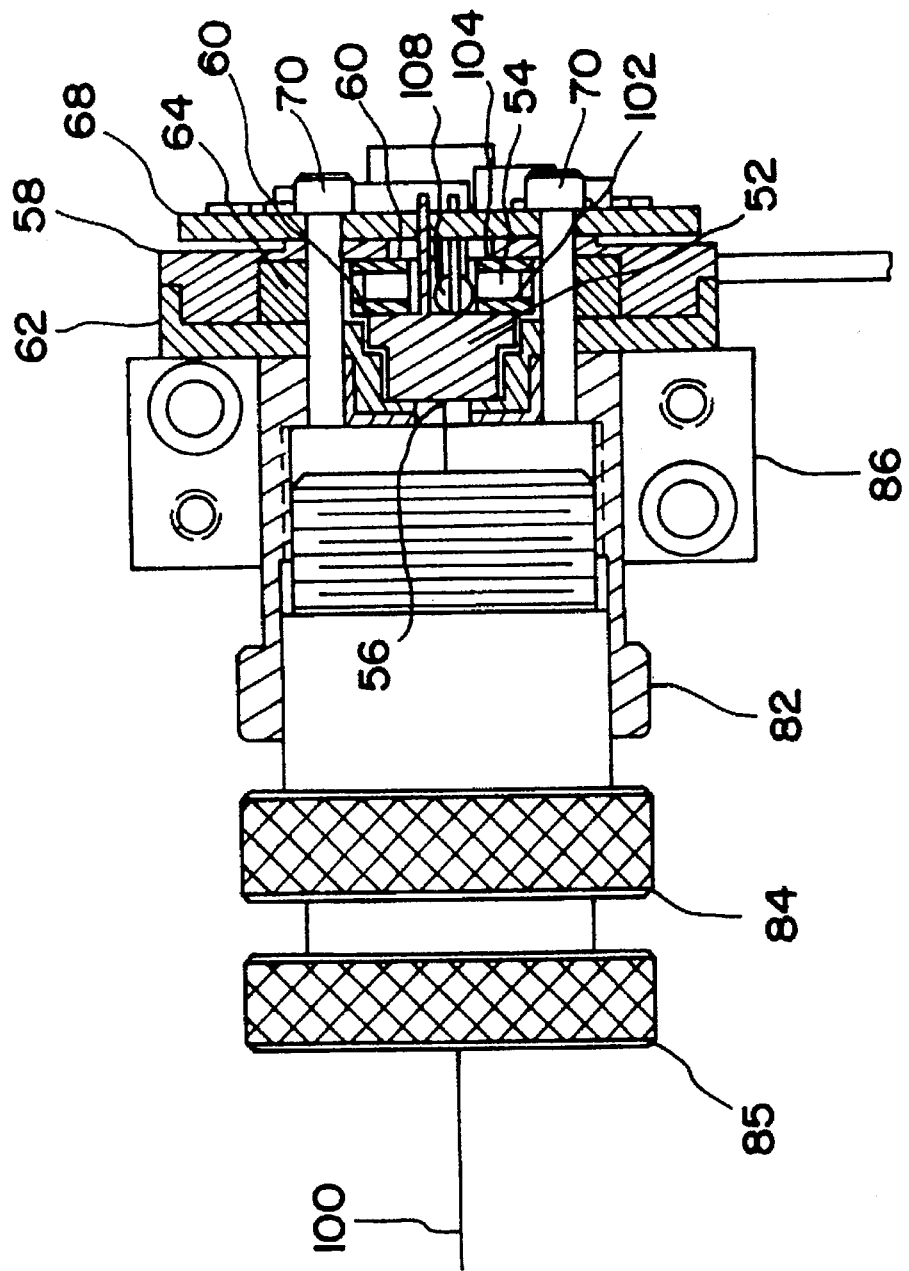
FIG. 4 is a cross-sectional view of an alternative embodiment the laser diode assembly.

An alternative embodiment of the invention is shown in FIG. 4. In this embodiment, the thermally conductive washer 92 and the Delrin® bushing 66 have been eliminated. The female heat sink 62 is configured to contact the top of the can around the periphery of the window 56. Accordingly, the female heat sink 62 conducts heat directly to the top of the can. Alternatively, a thermally conductive and electrically insulating washer may be placed between the female heat sink 62 and the top of the can. This would provide the thermal conduction required while preventing electrostatic discharges from damaging the laser diode unit 52.

A thermostatic control circuit located on the PC board 68 monitors the thermistor 108, which detects the temperature of the flange to ensure that the laser diode unit 52 is operating at the preferred temperature. When the temperature of the flange exceeds a predetermined temperature, the TE cooler 54 is turned on. When the temperature of the laser diode unit 52 drops below the predetermined temperature, the TE cooler 54 is turned off. Preferably, the set point for the thermostatic control circuit is 33° C.

Efficient cooling and low current requirements are achieved since the laser diode unit 52 is the only component being cooled. In the preferred embodiment, the laser diode 52 can be maintained at a temperature of 33° C. while ambient temperature is 50° C. Additionally, since the can will be warmed as the flange is cooled by the TE cooler 54 there is no need for separate cooling and heating components. The assembly 50 can operate in environments of up to 90% relative humidity without condensation forming on any optical surfaces.

Although the invention has been described in part by making detailed reference to the preferred embodiment, such detail is intended to be instructive rather than restrictive. It will be appreciated by those skilled in the art that many variations may be made in the structure and mode of operation without departing from the spirit and scope of the invention as disclosed in the teachings herein.

We claim:

1. A temperature regulated laser diode assembly comprising:

a heat sink having an interior chamber;

a laser diode unit having a window for emitting a laser beam;

a thermoelectric cooler, coupled between said laser diode and said heat sink, for removing heat from said laser diode;

an optical assembly, coupled to said heat sink, for focusing said laser beam;

a bushing, disposed around said laser diode unit, for aligning said laser diode unit with said optical assembly; and a washer, disposed between said optical assembly and said periphery of said window for conducting heat from said optical assembly to the periphery of said window.

2. The laser diode assembly of claim 1 wherein said heat sink comprises complimentary male and female portions.

3. The laser diode assembly of claim 1 further comprising a thermally insulating gasket mounted around said thermoelectric cooler for isolating said thermoelectric cooler from the ambient environment.

4. The laser diode assembly of claim 1 further comprising a printed circuit board, rigidly fixed to said heat sink, which includes means for driving said laser diode unit and said thermoelectric cooler.

5. The laser diode assembly of claim 4, further comprising a thermistor mounted on said printed circuit board for detecting the temperature of said laser diode unit.

6. A temperature regulated laser diode assembly comprising:

a laser diode subassembly comprising: a laser diode for emitting a laser beam; a base for mounting said laser diode and a housing for housing said laser diode; said housing having a window for permitting said laser beam to pass;

a thermoelectric cooler coupled to said base of said laser diode subassembly for removing heat from a portion of said laser diode subassembly;

a heat sink coupled to said thermoelectric cooler for transferring heat away from said thermoelectric cooler; and heat conduction means, coupled to said heat sink, for conducting a portion of said heat to the periphery of said window.

7. The laser diode assembly of claim 6 wherein said heat sink further comprises complementary male and female heat sink portions coupled to an optics barrel.

8. The laser diode assembly of claim 7 further comprising a thermally insulating gasket mounted around said thermoelectric cooler for isolating said thermoelectric cooler from the ambient environment.

9. The laser diode assembly of claim 8 further comprising a printed circuit board, rigidly fixed to said heat sink, which includes means for driving said laser diode and said thermoelectric cooler.

10. The laser diode assembly of claim 9, further comprising a thermistor mounted on said printed circuit board for detecting the temperature of said laser diode.

11. A method for regulating the temperature of a laser diode having a base and a beam emitting aperture, comprising the steps of:

removing heat from the base of said laser diode;

monitoring the temperature of the base of said laser diode; and conducting a portion of said removed heat to the beam emitting aperture when said temperature surpasses a predetermined threshold.

12. A temperature regulator for regulating the temperature of a laser diode assembly of a type having a base, a housing having a window therein and a laser diode, the laser diode being mounted on the base and enclosed by the housing such that a beam from the laser diode passes through the window, the regulator comprising:

a thermoelectric cooler coupled to the base of the laser diode assembly; and a thermally conductive member that transfers heat from the thermoelectric cooler to the periphery of said window.

13. The laser diode assembly of claim 12 wherein said thermally conductive member comprises a heat sink.

14. The laser diode assembly of claim 13 wherein said thermally conductive member further includes an electrically insulating member.

15. The laser diode assembly of claim 14 further comprising a thermally insulating gasket mounted around said thermoelectric cooler for isolating said thermoelectric cooler from the ambient environment.

16. The laser diode assembly of claim 15 further comprising a printed circuit board, rigidly fixed to said heat sink, which includes means for driving said laser diode and said thermoelectric cooler.

17. The laser diode assembly of claim 16, further comprising a thermistor mounted on said printed circuit board for detecting the temperature of said laser diode.

18. A temperature regulator for regulating the temperature of a laser diode assembly of a type having a base, a housing having a window therein and a laser diode, the laser diode being mounted on the base and enclosed by the housing such that a beam from the laser diode passes through the window, the regulator comprising:

a thermoelectrical cooler coupled to said base of the laser diode assembly for removing heat from the assembly;

a heat sink coupled to said thermoelectric cooler for transferring heat away from said thermoelectric cooler; and a heat transfer means coupled to said heat sink for conducting heat from the heat sink to the periphery of said window;

whereby the temperature of the laser diode is requested and the conducted heat prevents condensation from forming on the window of the laser diode assembly.

19. The regulator of claim 18 wherein said heat sink further comprises complementary male and female heat sink portions coupled to an optics barrel.

20. The regulator of claim 19 further comprising a thermally insulating gasket mounted around said thermoelectric cooler for isolating said thermoelectric cooler from the ambient environment.

21. The regulator of claim 20 further comprising a printed circuit board, rigidly fixed to said heat sink, which includes means for driving said laser diode and said thermoelectric cooler.

22. The regulator of claim 21, further comprising a thermistor mounted on said printed circuit board for detecting the temperature of said laser diode.

* * * * *